United States Patent [19]
Taniguchi et al.

[11] Patent Number: 4,927,739
[45] Date of Patent: May 22, 1990

[54] PHOTOSENSITIVE COMPOSITION CONTAINING A GELLING AGENT

[75] Inventors: Masaharu Taniguchi, Shiga; Chikara Ichijo, Kashiwa; Junichi Fujikawa, Kyoto, all of Japan

[73] Assignee: Toray Industries, Inc., Tokyo, Japan

[21] Appl. No.: 109,561

[22] Filed: Oct. 19, 1987

[51] Int. Cl.$^5$ .......................... G03C 1/68; G03C 1/70; G03C 1/71

[52] U.S. Cl. ...................... 430/286; 430/287; 430/906; 430/281; 430/270; 430/907; 522/110; 522/72; 522/78; 522/79

[58] Field of Search ............... 522/110, 72, 78, 79; 430/286, 287, 906, 281, 270, 907

[56] References Cited

U.S. PATENT DOCUMENTS

| | | | |
|---|---|---|---|
| 2,787,546 | 4/1957 | Smith et al. | 430/287 |
| 3,615,469 | 10/1971 | Ramp | 430/286 X |
| 4,170,481 | 10/1979 | Akama et al. | 430/286 X |
| 4,181,527 | 1/1980 | Toda et al. | 430/222 X |
| 4,195,997 | 1/1980 | Graham | 430/286 |
| 4,227,979 | 10/1980 | Humke et al. | 522/97 X |
| 4,252,888 | 2/1981 | Rohloff | 430/286 X |
| 4,362,808 | 12/1982 | Otthofer, Jr. | 430/281 X |
| 4,394,435 | 7/1983 | Farber et al. | 430/287 |
| 4,686,172 | 8/1987 | Worns et al. | 522/110 X |

FOREIGN PATENT DOCUMENTS 0121041  7/1984  Japan .................... 430/286

Primary Examiner—Paul R. Michl
Assistant Examiner—Cynthia Hamilton
Attorney, Agent, or Firm—Armstrong, Nikaido, Marmelstein, Kubovcik & Murray

[57] ABSTRACT

The present invention relates to a photosensitive composition containing at least one compound selected from the group consisting of N-acyl amino acid derivatives, hydroxycarboxylic acids and their derivatives, condensates of an aliphatic or aromatic aldehyde with a polyhydric alcohol, acylated polysaccharides and metallic soaps. From the photosensitive composition of the present invention, moldings having excellent shape retentivity and/or compatibility of the components thereof with one another can be produced. Therefore, the production of moldings from a composition which has been heretofore impossible is made possible. Particularly a composition having a good moldability during the molding operation can be employed. The composition is useful for the preparation of printing plate materials having a good developability and printing plates, particularly flexible printing plates and flexographic printing plates, having an improved ink solvent resistance.

15 Claims, No Drawings

PHOTOSENSITIVE COMPOSITION CONTAINING A GELLING AGENT

BACKGROUND OF THE INVENTION (1) Field of the Invention:

The present invention relates to a photosensitive composition. More particularly, the present invention relates to a photosensitive composition having excellent moldability and compatibility and suitable for use particularly as a material for flexible printing plates and further flexographic printing plates.

(2) Description of the Prior Art:

A photosensitive layer of a photosensitive master printing plate, particularly a solid master printing plate, essentially comprises a polymer component comprising a base polymer or a reactive base polymer, a photoreactive monomer or photoreactive oligomer, a photopolymerization initiator and, if necessary, other additives. The photosensitive layer is produced, for example, by a dry film-forming method wherein a solvent is used as described in Japanese Patent Publication Nos. 46-26125, 50-32645 and 57-28485 and U.S. Pat. Nos. 4,481,280 and 4,464,456. When the production of a flexographic printing plate from a synthetic rubber elastomer is intended, a photosensitive composition free of any solvent or having a high concentration as described in U.S. Pat. No. 3,674,486 or No. 4,517,278 is subjected to a calender molding method or melt extrusion molding method.

The dry film forming method wherein a solvent is used has advantages that the molding is conducted at a relatively low temperature, that the composition is not exposed to a high temperature and that a printing plate material having a homogeneous composition can be obtained. On the other hand, this method has problems that since the solvent must be removed by drying, the composition is inclined to be modified in the drying step, the plate material is liable to be strained and a thick plate cannot be produced easily and that since a large amount of a photoreactive monomer or oligomer cannot be used for preventing the fluidization in the drying step, the composition is limited. In the solvent-free calender molding method or melt extrusion method, the composition of the printing plate material easily becomes heterogeneous or it is inclined to be modified by heat, since the molding is conducted under conditions comprising a high shear, high temperature and high viscosity. Further, a composition which can be molded at a relatively low temperature has a problem that the shape retentivity of the obtained printing plate material is insufficient at ambient temperature.

In addition, a photosensitive composition has usually an essential problem that the compatibility of the components constituting the composition with one another is limited by the complicated structure thereof and, therefore, the components must be selected in a narrow limited range.

SUMMARY OF THE INVENTION

The present invention has been completed by overcoming the above-mentioned defects of the conventional methods.

An object of the present invention is to provide a photosensitive composition having such a moldability that it can be molded by a solvent-free casting method having advantages of both the dry film-forming method and the melt extrusion molding method to form a photosensitive printing plate material and also having another advantage that the components of the composition can be selected over wide ranges. In particular, when special compound(s) of the present invention is (are) incorporated into an ordinary photosensitive composition comprising a base polymer, photoreactive monomer and photoreactive initiator as indispensable components, the solidification of the composition can be remarkably accelerated even when the composition is liquid or fluid at ambient temperature, or the compatibility of the components of either liquid or solid photosensitive composition with one another can be improved and, therefore, components which could not be used because of a poor compatibility thereof have become usable and the range of the amount of components limited in the prior art has been widened. The inventors have found, in addition to these advantages, that the composition of the present invention can be effectively used as a material for photosensitive moldings or to impart special characters thereto. The present invention has been completed on the basis of these findings. In particular, the photosensitive polymer composition is capable of forming solid photosensitive polymer moldings having a high compatibility even when the amount of the base polymer is remarkably reduced. Taking advantage of these characters, the solvent-free or high-concentration cast molding is possible. As a result, a step of removing a solvent is unnecessary or the solvent can be removed in only a short step to solve problems such as a deterioration in the step of removing the solvent by heat or crack formation in the preparation of thick films. In addition to the improvement of the moldability, the photosensitive composition of the present invention has other advantages that when special component(s) according to the invention is (are) incorporated into an ordinary photosensitive composition, the compatibility of the components of the composition with one another can be remarkably improved and, therefore, the components can be selected from a wide variety of materials. As a result, desirable characters such as mechanical strength, solvent resistance and ink solvent resistance can be imparted to the moldings.

The present invention provides a photosensitive polymer composition containing at least one compound selected from the group consisting of N-acyl amino acid derivatives, hydroxycarboxylic acids and derivatives thereof, aliphatic or aromatic aldehyde/polyhydric alcohol condensates, acylated polysaccharides and metallic soaps. The present invention has been completed on the basis of a finding that when a compound as described above is incorporated into a photosensitive composition having only a low base polymer content, a high fluidity at room temperature and only a poor compatibility, the compound acts effectively to solidify the composition in the molding step thereof and, further, the compound can impart a good shape retentivity and homogeneity to the molding. Particularly when the present invention is employed in the production of solid state master printing plates, the intended printing plates having excellent plate wear, ink solvent resistance, etc. which could not be obtained in the prior art can be obtained.

DESCRIPTION OF THE PREFERRED EMBODIMENTS

The N-acyl amino acid derivatives used as the above-mentioned solidifying agent (gelling agent) and/or compatibilizing agent are those having 8 to 100, preferably 15 to 70, carbon atoms. Particularly, N-acyl amino acid amine salts, N-acyl amino acid amides and N-acyl amino acid esters are preferably used. Examples of the amino acids include α-, β- and ω-amino acids. Preferred examples of them include glycine, α- or β-alanine, valine, serine, phenylalanine, 3,4-dihydroxyphenylalanine, cysteine, methionine, β-aminocaproic acid, lysine, ornithine, arginine, glutamic acid and aspartic acid as well as mixtures of them. Further hydrolyzates of proteins such as soybeans, meats and Phycomycetes can be used. The N-acyl groups include straight-chain or branched, saturated or unsaturated aliphatic or aromatic acyl groups having 1 to 30 carbon atoms, preferably 4 to 20 carbon atoms. Among them, caproyl, capryloyl, lauroyl, myristoyl and stearoyl groups as well as a combination of them are preferred.

When the N-acyl amino acid derivatives are N-acyl amino acid esters, the alcohols used in the esterification are those having 1 to 30 carbon atoms, preferably 3 to 20 carbon atoms. Examples of particularly preferred alcohols include octyl, lauryl, cetyl, stearyl and isostearyl alcohols. Further cyclohexanol and benzyl alcohol are usable. When the N-acyl amino acid derivatives are N-acyl amino acid amides or N-acyl amino acid amine salts, the amines usable in the formation of the amides and amine salts include ammonia and primary and secondary amines and mono- and dialcoholamines having 1 to 120 carbon atoms, preferably 1 to 60 carbon atoms. When the derivatives are amine salts, tertiary amines and trialcoholamines are usable. Among them, butylamine, octylamine, laurylamine, stearylamine, isostearylamine, etc. are preferred. Further cyclohexylamine and benzylamine are usable.

Examples of the N-acyl amino acid derivatives include N-lauroylglutamic acid dibutylamide, N-lauroylglutamic acid stearylamide, N,N'-dicaproyllysine acrylamide, N,N'-dicaproyllysine laurylamine salt, N,N'-dicaproyllysine lauryl ester and N-lauroylphenylalanine laurylamide.

The hydroxycarboxylic acids and their derivatives include those having at least one hydroxyl group and at least one carboxyl group in the molecule, such as 12-hydroxystearic acid, 4-hydroxylauric acid and 5-hydroxyoctanoic acid and ricinoleic acid as well as their derivatives. In particular, hydroxycarboxylic acids having 4 to 40 carbon atoms, preferably 8 to 20 carbon atoms, and esters, amides and metal salts of them are used.

The metals constituting the metal salts are those of Groups I to IV, preferably Groups I and II, of the Periodic Table. Among these metals, sodium, calcium, barium and zinc are preferred. Among these hydroxycarboxylic acids, 12-hydroxystearic acid or its metal salt is preferably used.

The condensates of an aliphatic or aromatic aldehyde with a polyhydric alcohol are condensates of an aliphatic aldehyde having 2 to 40 carbon atoms, preferably 3 to 20 carbon atoms or an aromatic aldehyde having 7 to 40 carbon atoms, preferably 7 to 20 carbon atoms, with a polyhydric alcohol having 2 to 40 carbon atoms, preferably 4 to 20 carbon atoms. Examples of the condensates include benzylidenesorbitol, dibenzylidenesorbitol, tribenzylidenesorbitol, dibenzylidenexylytol, dibenzylidenemannitol, propylidenesorbitol, dipropylidenesorbitol, cinnamylidenesorbitol and dicynnamylidenesorbitol. Among the aldehydes, benzaldehyde is particularly preferably used. Among the polyalcohols, tetrahydric ones or higher ones are preferably used. They include, for example, sorbitol, xylytol, mannitol and pentaerythritol. Among them, D-sorbitol is preferably used. As for the degree of the condensation of the polyhydric alcohol with the aliphatic or aromatic aldehyde, the condensates of a polyhydric alcohol with the aldehyde in a molar ratio of 1:1, 1:2 or 1:3 or a mixture of them can be used.

The acylated polysaccharides usable in the present invention include condensates of a polysaccharide such as cellulose, dextrin or galactogen with a fatty acid having 8 to 20 carbon atoms, such as 2-ethylhexanoic acid, stearic acid, oleic acid or lauric acid.

Metallic soaps include metal salts of carboxylic acids having 6 to 40 carbon atoms, preferably 8 to 20 carbon atoms, such as 2-ethylhexanoic acid, stearic acid, oleic acid, lauric acid, p-tert-butylbenzoic acid, benzoic acid and phthalic acid.

The metals of the metallic soaps include metals of Groups I to IV of the Periodic Table, such as aluminum, zinc, barium, magnesium, sodium and lead. Among the salts, metallic salts of fatty acids are preferred.

Among the above-mentioned compounds, those particularly suitable for the object of the present invention are N-acyl amino acid amides, dibenzylidenesorbitol and 12-hydroxystearic acid.

The present invention has been completed, taking advantage of the fact that at least one compound selected from the group consisting of N-acyl amino acid derivatives, hydroxycarboxylic acids and their derivatives, condensates of an aliphatic or aromatic aldehyde with a polyhydric alcohol, acylated polysaccharides and metallic soaps acts as a gelling agent and/or compatibilizer (hereinafter referred to collectively as gelling agent component) for the photosensitive composition. These compounds are used either singly or in the form of a mixture of them. From the viewpoint of synergism, a mixture of two or more of them is preferred.

The amount of these compound is preferably at least 0.1 wt. %, more preferably 0.1 to 20 wt. % and particularly 0.5 to 10 wt. %, based on the photosensitive composition.

As the components other than the gelling agent component constituting the photosensitive composition of the present invention, all of the constituents of known photosensitive compositions can be used.

Namely, the photosensitive polymer composition comprises, in addition to the above-mentioned gelling agent component, base polymer, photoreactive monomer or oligomer, photopolymerization initiator and, if necessary, other additives. As these components, all of known ones can be used. The polymers include, for example, polyvinyl cinnamate, polyamide, polyester, polyurethane, polyvinyl alcohol, polyacryl, unsaturated polyesters having a double bond in the molecule, unsaturated polyurethane, silicone resin, polystyrene/polybutadiene block copolymer, polystyrene/polyisoprene block copolymer, polybutadiene, polystyrene/polyisoprene copolymer, ethylene/vinyl acetate copolymer, polyisoprene, butyl rubber, nitrile rubber and natural rubber.

The polymers modified by introducing, for example, a double bond, an acid anhydride group, a hydroxyl group, a carboxyl group or the like into a terminal, side chain or main chain of the above-mentioned polymers can also be used. The polymers are suitably selected depending on the characters required of the intended photosensitive polymer moldings.

The amount of the polymer to be incorporated in the photosensitive composition of the present invention can be reduced as compared with that used in the prior art and a polymer which could not be used in the prior art because of its poor compatibility can be used and, in addition, a blend of two or more polymers can be used, taking advantage of the photosensitive composition of the present invention that the solidification thereof and compatibilization of the components are remarkably improved at ambient temperature (5° to 40° C.).

The photoreactive monomer or oligomer can be selected from all of known compounds depending on the characters required of the intended photosensitive moldings and the polymer used. When a polyolefin, polyene or its copolymer or a modification thereof is used as the base polymer, typical examples of the monomer or oligomer in the composition include liquid rubber components such as liquid polybutadiene and liquid polyisoprene having double bonds or their modifications, and/or monoacrylates, methacrylates, polyfunctional-acrylates and polyfunctional-methacrylates produced by reacting an alcohol having 1 to 40 carbon atoms, preferably 2 to 20 carbon atoms, with an unsaturated carboxylic acid such as acrylic or methacrylic acid.

When the composition contains polyvinyl cinnamate, polyamide, polyester, polyurethane, polyvinyl alcohol, polyacryl or copolymer or modification thereof as the base polymer, the photoreactive monomers or oligomers which can be contained therein include not only monoacrylates, monomethacrylates, polyfunctional-acrylates and polyfunctional-methacrylates produced by reacting a monohydric or polyhydric alcohol having 1 to 40, preferably 2 to 20, carbon atoms with an unsaturated carboxylic acid such as acrylic or methacrylic acid and also unsaturated amides produced by reacting an unsaturated carboxylic acid with ammonia or an alkylamine or alkanolamine having 1 to 40 carbon atoms, preferably 1 to 20 carbon atoms, and acrylates, methacrylates, polyfunctional-acrylates or polyfunctional-methacrylates prepared by reacting an unsaturated epoxy compound with a carboxylic acid, polycarboxylic acid, unsaturated carboxylic acid or amino acid having 2 to 40 carbon atoms, preferably 2 to 20 carbon atoms. Further, acrylates, methacrylates, polyfunctional-acrylates or polyfunctional-methacrylates of oligomers having a urethane bond and/or ester bond and/or ether bond are mainly used.

The incorporation of the photoreactive monomer or oligomer in the photosensitive polymer composition of the present invention makes it possible to use monomers or oligomers which could not be used in the prior art because of a poor compatibility thereof. By the incorporation of the monomer or oligomer, the photosensitive polymer moldings prepared from the composition has preferred mechanical and chemical characteristics. In addition, a mixture of the photoreactive monomer(s) and/or oligomers which could not be mixed because of the poor compatibility of them with one another in the prior art became usable.

The amounts of the base polymer or the photoreactive monomer or oligomer in the photosensitive composition of the present invention are not particularly limited but determined suitably depending on the use and characters required of the intended photosensitive moldings. For example, when an adhesive, sealing agent or sealant is intended, a base polymer-free composition can be used. However, when a solid photosensitive master printing plate material (the main object of the present invention) is intended, the amount of the polymer is 2 to 95 wt. %, preferably 3 to 40 wt. %, based on the photosensitive composition. The total amount of the photoreactive monomer(s) or oligomer(s) is 2 to 95 wt. %, preferably 40 to 90 wt. %.

When the solid photosensitive master printing plate material is intended, one of the most preferred compositions of the present invention comprises a polyolefin or polyene having a number-average molecular weight of 30,000 to 500,000 as the polymer, a photoreactive monomer and/or a polyene having a number-average molecular weight of 500 to 20,000 (corresponding to the photoreactive oligomer), a photoreaction initiator and a gelling agent component as the indispensable components. Though the amount of the polyolefin or polyene having a number-average molecular weight of 30,000 to 500,000 varies depending on the kind thereof used, it is usually 2 to 95 wt. %, preferably 5 to 40 wt. % and more preferably 7 to 30 wt. %, based on the photosensitive composition. The total amount of the photoreactive monomer and the polyene having a number-average molecular weight of 500 to 20,000 is 2 to 95 wt. %, preferably 10 to 90 wt. % and more preferably 40 to 90 wt. %. The amount of the photoreaction initiator is preferably in the range of 0.1 to 10 wt. %. The amount of the gelling agent component of the present invention is preferably 0.5 to 10 wt. %.

When the polyolefin or polyene having a number-average molecular weight of 30,000 to 500,000 is used in a large amount, it acts as the base polymer of the photosensitive composition and the gelling agent component acts as the compatibilizer to contribute to widen the selectivity range of the components. On the other hand, when the amount of the polyolefin or polyene is small, it acts mainly as a polymeric gelling agent to solidify the composition together with the gelling agent component and to impart a practical shape retentivity to the printing plate material. Therefore, the amount of the polyolefin or polyene having a number-average molecular weight of 30,000 to 500,000 is preferably 7 to 30 wt. % from the viewpoint of the moldability, workability and developability in the production of the printing plate material.

A preferred photosensitive composition to be used in the production of the solid-state photosensitive printing plate material comprises the alcohol-soluble polyamide or polyesteramide, the photoreaction monomer and/or photoreactive oligomer, the photoreaction initiator and the gelling agent component as the indispensable components.

The amount of the alcohol-soluble polyamide or polyesteramide in the photosensitive composition is 2 to 95 wt. %, preferably 3 to 40 wt. % and more preferably 5 to 23 wt. %. The total amount of the photoreactive monomer and oligomer is 2 to 95 wt. %, preferably 20 to 90 wt. % and more preferably 40 to 90 wt. %. The amount of the photoreaction initiator is 0.1 to 10 wt. %, and that of the gelling agent component is 0.5 to 10 wt. %.

The alcohol-soluble polyamide or polyesteramide acts as the base polymer and/or polymeric gelling agent and the gelling agent component acts effectively and mainly as a compatibilizer. By using the gelling agent component, the composition which could not be practically employed because of the poor compatibility in the prior art becomes usable according to the present invention. When a solid-state photosensitive printing plate material having excellent moldability, compatibility and developability and capable of forming a flexible printing plate or flexographic printing plate developable with water and/or an alcohol is intended to attain the principal object of the present invention, it is preferred that the amount of the alcohol-soluble polyamide or polyesteramide used is reduced as far as possible so far as a practical strength of the printing plate material can be maintained.

The alcohol-soluble polyamides which act as the polymeric gelling agent in the composition are polyamides soluble in alcohols having 1 to 18 carbon atoms, mixtures of at least 50 wt. % of such an alcohol with the balance of water or mixtures of such an alcohol with an ester at room temperature or under heating. They are polyamides obtained by polycondensing a lactam having a 5- to 13-membered ring and/or an aminocarboxylic acid constituting the lactam and/or a diamine/dicarboxylic acid salt or modified polyamides soluble in alcohols, such as N-alkoxymethylated polyamides. Examples of the starting materials for these polyamides include lactams such as caprolactam, enantholactam, caprylolactam, laurolactam, methyl-ε-caprolactam, ethyl-ε-caprolactam and ethylenantholactam; diamines such as pentamethylenediamine, hexamethylenediamine, heptamethylenediamine, octamethylenediamine and C- and/or N-substituted derivatives of these amines, such as N-methyl- or N-ethylhexamethylenediamine and 1,6-diamino-3-methylhexane; alicyclic diamines such as 1,4-diaminocyclohexane and p,p'-bis(4-aminocyclohexyl)-methane; aromatic diamines such as m-phenylenediamine, m-xylylenediamine and 4,4'-diaminodiphenylmethane; and further α,ω-diaminopropylpolyoxyethylene, N,N'-dimethyl-N,N'-bis(3-aminopropyl)ethylenediamine, N-bis(2-aminoethyl)methylamine and bis(aminopropyl)piperazine. Examples of the dicarboxylic acids include succinic, adipic, sebacic and dodecanedicarboxylic acids as well as substitution products of them such as α,α-diethyladipic acid, α-ethylsuccinic acid and ω,ω'-octane-or -nonanedicarboxylic acid; dicarboxylic acids having an aliphatic ring such as 1,4-cyclohexanedicarboxylic acid, 1,2-cyclohexanedicarboxylic acid, dicyclohexyl-4,4'-dicarboxylic acid and methylhimic acid; and dicarboxylic acids having an aromatic ring, such as terephthalic acid, isophthalic acid, phthalic acid, naphthalene-2,6-dicarboxylic acid, naphthalene-2,7-dicarboxylic acid, diphenyl-4,4'-dicarboxylic acid, diphenoxyethanedicarboxylic acid and sodium 5-sulfoisophthalate.

To attain the principal object of the present invention, i.e. to obtain a solid flexible printing plate material developable with water and/or alcohol, particularly N-alkoxymethylated polyamides and polyetheramides having a polyethylene oxide segment in the main chain are preferred among the above-mentioned alcohol-soluble polyamides.

The alcohol-soluble polyesteramides are those soluble in alcohols having 1 to 18 carbon atoms, mixtures of at least 50 wt. % of such an alcohol with the balance of water or mixtures of alcohol esters at room temperature or under heating. They are polyesteramides obtained by polycondensing a polyester-forming diol/dicarboxylic acid with a lactam having a 5- to 13-membered ring and/or an aminocarboxylic acid constituting the lactam and/or an aminocarboxylic acid constituting the lactam and/or a diamine/dicarboxylic acid salt or modified polyesteramides soluble in alcohols. They are polymers containing both ester bond and amide bond in the main chain.

The diols constituting the polyesteramides include preferably, for example, polyethylene glycol, poly(1,2- or 1,3-propylene oxide) glycol, poly(tetramethylene oxide) glycol, poly(hexamethylene oxide) glycol and block or random copolymer of ethylene oxide and propylene oxide. Further alkylene glycols and their C-substituted derivatives are also usable. The dicarboxylic acids, lactams, aminocarboxylic acids and diamines are the same as those used as the starting materials for the alcohol-soluble polyamides.

The alcohol-soluble polyesteramides produced by introducing an ester bond into the main chain of the alcohol-soluble polyamides usually form block copolymers.

The amount of the polyester block in the polyesteramide in the composition of the present invention is preferably 30 to 90 wt. %, more preferably 40 to 80 wt. %.

By the introduction of such an ester bond, the workability of the composition of the present invention and the characters of the moldings are modified. When the polyesteramide is used as the polymeric gelling agent, moldings having a good shape retentivity can be obtained even when the amount of the polyesteramide is smaller than that of the polyamide. Further in such a case, the components constituting the composition can be selected from wider ranges and, therefore, moldings having more excellent mechanical properties, solvent resistance, etc. can be obtained. In order to obtain a solid flexographic printing plate material developable with water and/or an alcohol, polyether esteramide having a polyalkylene glycol segment in the main chain is particularly preferred among the above-mentioned polyesteramides.

Among the photosensitive compositions containing both the polymeric gelling agent comprising the alcohol-soluble polyamide or polyesteramide and the gelling agent component, those containing 1 to 30 wt. % of a polyene having a number-average molecular weight of 500 to 20,000 and/or 1 to 30 wt. % of a urethane oligomer having at least one photoreactive group in the molecule and a number-average molecular weight of 300 to 10,000 are particularly useful for imparting a rubber elasticity, flexibility, solvent resistance, etc. In also these compositions, the gelling agent component acts effectively as the compatibilizer.

It is preferred that at least a part of the photoreactive monomers used together with the alcohol-soluble polyamide or polyesteramide is an acrylate or methacrylate having at least one hydroxyl group in the molecule. Acrylates or methacrylates having a hydroxyl equivalent in the range of 50 to 400 are particularly preferred.

Reasons for why the hydroxyl equivalent of the acrylate or methacrylate is limited in the above-mentioned range are that within this range, the ethylenically unsaturated compound is highly compatible with the polyamide or polyesteramide used in the present invention and that within this range, a good solid state can be produced with a small amount of the polyamide or polyesteramide at room temperature. From this viewpoint, the acrylate or methacrylate in the composition of the present invention prefers to comprise an ethylenically unsaturated compound having a hydroxyl equivalent of 150 to 350. The acrylate or methacrylate having a hydroxyl equivalent in the above-mentioned range is highly compatible with the alcohol-soluble polyamide or polyesteramide to produce a good solid state without reducing the power of the hydrogen bond of the polyamide or polyesteramide.

The photosensitive composition of the present invention may contain any of known photoreaction initiators and sensitizers such as benzoin alkyl ethers, benzophenones, anthraquinones, benzils, acetophenones and diacetyls. Further the composition may contain any of known additives such as plasticizers, polymerization inhibitors for increasing the heat stability and storage stability of the photosensitive composition, dyes, pigments, surfactants, antifoaming agents, U.V. absorbers, deodorants and flavors.

Moldings can be produced from the photosensitive composition of the present invention usually by a process wherein the gelling agent component of the present invention is mixed with the polymer, photoreactive monomer or oligomer, photoreaction initiator and other additives under heating to obtain a fluid mixture and molding the mixture by a known molding process. The production process is, however, not limited to this process and the order of the mixing of the components is also not particularly limited.

The dissolution temperature is usually 50° to 300° C., preferably 70° to 200° C. The molding temperature is suitably selected depending on the molding process and is not particularly limited.

The photosensitive composition containing the gelling agent component of the present invention is characterized in that it has a highly solidified state and/or compatibility particularly in a low-temperature region around room temperature. Therefore, a composition essentially different from conventional photosensitive composition can be produced. For example, when the photosensitive composition of the present invention is used as a material for a solid photosensitive printing plate, it exhibits a good fluidity at a relatively low temperature of lower than 150° C. or more preferably 60° to 100° C. in the molding step. At room temperature in the range of 0° to 40° C., it is in the form of a gelled solid printing plate material having excellent homogeneity and shape retentivity and only a low surface adhesion. The gelling agent component of the present invention is capable of making the composition a reversible gel which is in liquid form under heating and in solid form at a low temperature. The composition can be molded by an easy method such as a solvent-free casting method, taking advantage of such a property.

Another characteristic feature of the photosensitive composition of the present invention is that the compatibility of the components constituting the moldings and cured products thereof with each other is high. Therefore, oozing out of the components is only slight and the mechanical strengths of the product are high.

The photosensitive composition of the present invention is usually used as a material for photosensitive printing plates. In such a case, the photosensitive layer can be formed by flow-casting the material molten by heating on a support at a temperature of 50° to 200° C., preferably 60° to 150° C. The sheet thus formed is cooled by leaving to stand at room temperature or by cooling with cold air or by means of a cooling roll to obtain a solid sheet. The sheet is placed on another support to form a laminate or it is directly used to form a solid photosensitive printing plate.

Metal plates such as a steel, stainless steel, aluminum or copper plate, plastic sheets such as a polyester or polypropylene film and synthetic rubber sheets are used as the support.

Though it is usually preferred that the photosensitive layer has a thickness of 0.1 to 20 mm, the photosensitive polymer composition of the present invention is particularly characterized in that a thick photosensitive layer can be prepared therefrom with a high precision.

Conventional film-forming processes have problems. In particular, for example, in a dry process for forming a film, the drying is difficult particularly when the film to be prepared is thick. In an extrusion process, the control of the thickness of the extruded sheet with a roll is difficult, since the sheet is elastic. On the contrary, when the composition of the present invention is used, the drying is unnecessary, since substantially no solvent is used, and the thickness can be easily controlled with a roll, since the sheet is not elastic because gelation does not proceed so much in the thickness-controlling step.

A printing relief image can be formed from the photosensitive composition of the present invention by contacting a negative or positive film of an original on the photosensitive layer and exposing it to ultraviolet rays of mainly 300 to 400 mμ by using a high-pressure mercury lamp, an ultra-high pressure mercury lamp, a metal halide lamp, a xenon lamp, a carbon arc lamp or a chemical lamp to cure it by a photo-induced reaction. Then non-cured parts are dissolved in a solvent by means of a spray developing device or a brush developing device to form a relief on the support.

The photosensitive composition of the present invention is characterized in that it is prepared by modifying a composition which is liquid or nearly liquid at room temperature so that it can be handled as a solid at room temperature. Therefore, this composition is usable as a solid printing plate material for flexible printing plates, flexographic printing plates, etc. The effects of the composition is exhibited most remarkably when it is used as a relief printing plate material and it is usable also as a material for lithographic printing plates, intaglio plates, stencil printing plates and photoresists. When the printing plate material prepared from the photosensitive composition of the present invention is used for the preparation of the photosensitive printing plates, an excellent developability is exhibited in the development using a suitable developer selected depending on the composition, since the amount of the carrier polymer contained therein can be very small as described above. Another advantage of the composition is, therefore, that the developer can be selected over a wide range.

In ordinary solid photosensitive printing plates, only the base polymer contributes to the retention of the shape of the plate in principle and other components are dissolved in the base polymer and, therefore, the amount of the base polymer is inevitably large to reduce the developability. Further the solid photosensitive printing plate of the present invention may contain a large amount of the photoreactive monomer or oligomer. Such a printing plate has excellent developability, solvent resistance and ink solvent resistance and, therefore, it has an excellent plate wear.

The photosensitive composition of the present invention can be used for various purposes in addition to those described above. In particular, it can be used as a material of photosensitive moldings in the form of blocks, elastic sheets curable by actinic radiations, as well as adhesives, sealing agents, sealants, etc., taking advantage of the possibility of the solvent-free molding technique.

[Examples]

The following examples will further illustrate the present invention, in which parts are given by weight.

Example 1:

25 parts of crystalline 1,2-polybutadiene (JSR RB810; a product of Japan Synthetic Rubber Co., Ltd., having a number-average molecular weight of about 100,000) used as the polymer was dissolved in 65 parts of liquid polybutadiene (Nisseki Polybutadiene B-700; a product of Nippon Petrochemicals Co., Ltd.) used as the photoreactive oligomer by stirring under heating at 125° C. 10 parts of trimethylolpropane trimethacrylate (photoreactive monomer), 1.5 parts of N-lauroyl-L-glutamic acid $\alpha,\gamma$-di-n-butylamide and 1.5 parts of 12-hydroxystearic acid (gelling agent component), 2 parts of dimethyl benzil ketal (photoreaction initiator) and 0.05 part of hydroquinone (stabilizer) were added to the solution under stirring and the mixture was thoroughly stirred.

The photosensitive polymer composition thus obtained was flow-cast in a thickness of 2 mm at 120° C. on a polyester film support having a thickness of 120$\mu$ to which an adhesive comprising a mixture of a polyester and a synthetic rubber had been applied and cured. The viscosity of the photosensitive polymer composition in the flow-casting step was about 80 P at 120° C. and the composition exhibited, therefore, a good fluidity. The photosensitive polymer composition thus flow-cast on the support was solidified by cooling to room temperature (25° C.) to form a solid plate having a sufficient shape retentivity. The surface of the plate was substantially non-sticky.

A testing negative film (133 lines, 3%, 5% and 10% halftone dots; diameter of independent dots: 200$\mu$ and 300$\mu$, width of fine lines: 50$\mu$ and 70$\mu$) were vacuum-adhered to the photosensitive layer of the printing plate material thus obtained. It was exposed to a light from a high-pressure mercury lamp exposure device for 3 min. Then it was developed with a brush-type developing apparatus containing trichloroethane having a temperature of 30° C. After the development for 2 min, non-exposed areas were removed by dissolution to form a relief image on the support. The obtained relief was capable of reproducing 5% dots, 300-$\mu$ independent dots and 50-$\mu$ fine lines. The cured plate had a Shore A hardness of 45 and an excellent flexibility. It was suitable for use as a flexographic printing plate.

In the printing tests of the plate prepared as above conducted with a water ink, good prints could be obtained.

Comparative Example 1:

A photosensitive polymer printing plate was prepared in the same manner as in Example 1 except that none of N-lauroyl-L-glutamic acid $\alpha,\gamma$-di-n-butylamide and 12-hydroxystearic acid was used. This product could not be used as the solid printing plate, since it had an insufficient shape retentivity and the surface thereof was sticky.

Example 2:

A flexible printing plate material could be prepared in the same manner as in Example 1 except that no 12-hydroxystearic acid was used and the amount of N-lauroyl-L-glutamic acid $\alpha,\gamma$-di-n-butylamide was 3 parts. The plate material thus obtained had nearly the same level of the halftone dot reproducibility as in Example 1 and a Shore A hardness of 30. The printing plate thus having a high flexibility was suitable for use as a flexographic printing plate.

Example 3:

A printing plate was prepared in the same manner as in Example 1 except that only 3 parts of 12-hydroxystearic acid was used as the gelling agent without using N-lauroyl-L-glutamic acid $\alpha,\gamma$-di-n-butylamide. The half tone reproducibility level of the printing plate was nearly equal to that obtained in Example 1. The plate had a Shore A hardness of 50.

Example 4:

25 parts of the same crystalline 1,2-polybutadiene as in Example 1 was dissolved in a mixture of 35 parts of liquid polybutadiene (Nisseki Polybutadiene B-2000; a product of Nippon Petrochemicals Co., Ltd.) as 30 parts of stearyl acrylates containing 500 ppm of hydroquinone under stirring and heating at 125° C. 10 parts of trimethylolpropane trimethacrylate, 2 parts of aluminum distearate and 1.5 parts of dimethyl benzil ketal were added to the solution and the mixture was thoroughly stirred.

A photosensitive polymer composition obtained as above was flow-cast in the same manner as in Example 1 to obtain a solid-state printing plate material having a sufficient shape retentivity.

A printing plate having an excellent halftone dot reproducibility was prepared from the material obtained as above in the same manner as in Example 1. The plate had a Shore A hardness of 60.

Example 5:

20 parts of partially saponified polyvinyl acetate having a degree of saponification of 80 molar % and an average degree of polymerization of 850 was dissolved in 30 parts of a solvent mixture of ethanol and water (weight ratio: 50/50) under stirring at 90° C. 35 parts of a compound obtained by an addition reaction of 1 mol of propylene glycol glycidyl ether and 2 mol of acrylic acid, 25 parts of dimethacrylate of polyethylene glycol having an average degree of polymerization of 6, 20 parts of glycerol and 2 parts of dimethyl benzil ketal as photopolymerizable monomers were added to the solution. The temperature was elevated to 95° C. and the ethanol/water solvent mixture was distilled off. 2 parts of dibenzylidene-sorbitol prepared from D-sorbitol and benzaldehyde and 2 parts of 12-hydroxystearic acid both as the gelling agent component were added to the mixture obtained as above and then the mixture was stirred at 110° C. to obtain a solution.

The photosensitive polymer composition thus obtained was flow-cast on a polyester support having a thickness of 150$\mu$ to which an epoxy adhesive had been applied and cured so that the product would have a thickness of 1500$\mu$ including that of the support.

The flow-cast film was solidified at room temperature (25° C.) to form a solid-state photosensitive printing plate material. The same testing negative film as in Example 1 was vacuum-adhered to the photosensitive layer of the printing plate thus obtained and exposed to a light from a high-pressure mercury lamp exposing device for 3 min. Then the development was conducted manually by means of a brush using neutral water having a temperature of 30° C. to form a relief image on the support.

The relief had an excellent reproducibility of 3% halftone dots, 200-μ independent dots and 50-μ fine lines.

Comparative Example 2:

The same procedure as in Example 5 was repeated except that none of dibenzylidenesorbitol and 12-hydroxystearic acid was used. However, the flow-cast film formed a sol and the intended solid printing plate could not be obtained.

Example 6:

The same procedure as in Example 5 was repeated except that 2 parts of dibenzylidenesorbitol was replaced with 3 parts of an ester (esterification rate: 20%) prepared from cellulose and stearic acid by dehydration condensation. The solid-state photosensitive printing plate material had nearly the same characters as those of the product obtained in Example 5.

Example 7:

20 parts of a polyether esteramide elastomer (PEBAX 2533, marketed by Toray Industries, Inc.) was dissolved in a mixture of 25 parts of caprolactone-modified 2-hydroxyethyl acrylate of the formula:

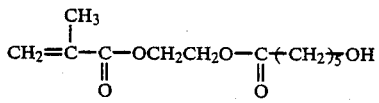

50 parts of ethylene oxide-modified phthaloyl acrylate of the formula:

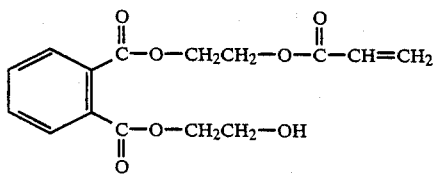

5 parts of urethane oligomer diacrylate (Goselac UV-3000B; a product of The Nippon Synthetic Chemical Industry Co., Ltd.), 1.5 parts of benzil dimethyl ketal and 0.05 part of hydroquinone under stirring and heating at 140° C. 1.2 parts of N-lauroyl-L-glutamic acid α,γ-di-n-butylamide and 1.2 part of dibenzylidenesorbitol both as the gelling agent component were added thereto to obtain a homogenous solution having a viscosity of 38P at 120° C. The solution was flow-cast over a polyester film support having a thickness of 130μ, to which a polyester adhesive had been applied and cured previously, to form a photosensitive layer having a thickness of 1500μ. The product was left to stand at room temperature to obtain a solid photosensitive printing plate material.

A gray-scale negative film for the photosensitivity determination (21 Steps Sensitivity Guide; a product of Stouffer Co.) and a negative film for the image-reproducibility test (150 lines, 3%, 5% and 10% halftone dots; diameter of independent dots: 200μ and 300μ, width of fine lines: 50μ and 70μ) were vacuum-adhered to the photosensitive layer of the printing plate material, and then exposed to a light from a chemical lamp for 10 min.

After completion of the exposure, the development was conducted with a brush-type developing apparatus containing ethanol (ethanol temperature: 30° C.). After the development for 2 min and 20 sec, a relief image having a depth of 1,000μ was formed.

The obtained relief image was examined to reveal that up to 16 steps remained in the gray scale portion and that 5% halftone dots, 200μ independent dots and 50μ fine lines were completely reproduced in the printing area. The obtained plate had a Shoe A hardness of 65 after the exposure to a light from a chemical lamp for 20 min. A flexographic printing plate was prepared from this material and subjected to printing tests with a water ink to obtain 50,000 excellent prints.

Comparative Example 3:

The same procedure as in Example 7 was repeated except that no gelling agent component was used. The solid-state printing plate thus obtained had only a poor compatibility and impractical.

Example 8:

A polyamide resin (Nylon CM 1041; a product of Toray Industries, Inc.) was N-methoxymethylated by a known method to obtain N-methoxymethylated polyamide having an N-methoxymethylation rate of 28.5%. 55 parts of an equimolar salt of α,ω-diaminopolyoxyethylene (obtained by adding acrylonitrile to both ends of a polyoxyethylene having a number-average molecular weight of 600 and reducing the product with hydrogen) with adipic acid, 25 parts of ε-caprolactam and 20 parts of a salt of hexamethylenediamine and adipic acid were melt-polymerized under ordinary conditions to obtain a polyetheramide having a relative viscosity of 2.4 (determined by dissolving 1 g of the polymer in 100 ml of chloral hydrate and measuring the viscosity of the solution at 25° C.).

7.5 parts of the N-methoxymethylpolyamide and 7.5 parts of polyetheresteramide were added to a mixture of 55 parts of caprolactone-modified 2-hydroxyethyl methacrylate, 10 parts of the plasticizer A and 0.05 part of hydroquinone. The mixture was stirred under heating at 140° C. for 2 h to obtain a homogeneous solution. 1.5 parts of benzil dimethyl ketal and 3.0 parts of N-lauroyl-L-glutamic acid α,γ-di-n-butylamide were dissolved in the solution. Then the same treatment as in Example 7 was repeated to obtain a solid printing plate material.

The same gray-scale negative film for the measurement of the sensitivity and a negative film for the image reproducibility test were vacuum-adhered to the photosensitive printing plate material and exposed to a light from a 2-kW ultra-high-pressure mercury lamp (a product of Ohk Seisakusho, Inc.) for 3 min.

After completion of the exposure, the development was conducted with a brush-type developing apparatus containing neutral water as the developer (water temperature: 30° C.). After the development for 4 min, a relief image having a depth of 1,000μ was obtained.

The obtained relief image was examined to reveal that up to 15 steps remained in the gray-scale portion and that 5% halftone dots, 200-μ independent dots and 50-μ fine lines were completely reproduced in the printing area. The printing plate had a Shore A hardness of 57. This was a flexographic printing plate having a printability with a water ink. The plasticizer A used herein was a compound obtained by an addition reaction of 136 parts (1 mol) of m-xylylenediamine with 460 parts (2 mol) of caprolactone-modified 2-hydroxyethyl acrylate followed by an addition reaction of the product with 392 parts (2 mol) of 2-ethylhexyl glycidyl ether.

Comparative Example 4:

The same procedure as in Example 8 was repeated except that no N-lauroyl-L-glutamic acid-α,γ-di-n-butylamide was used. The resulting solid-state printing plate material was practically not so useful, since the components oozed out after leaving to stand at room temperature.

Example 9:

40 parts of ε-caprolactam was melt-polycondensed with 60 parts of an equimolar mixture of polyethylene glycol having a number-average molecular weight of 600 and terephthalic acid to obtain a polyether esteramide having a softening point of 185° C. and a relative viscosity (determined by dissolving 0.5 g of the polymer in 100 ml of o-chlorophenol and examined at 25° C.) of 2.10.

15 parts of the polyether esteramide was mixed with 55 parts of an ethylene oxide-modified phthaloyl acrylate of the formula:

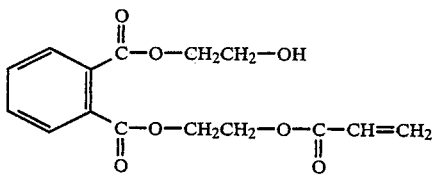

5 parts of urethane diacrylate (UV-2000 B; a yellowing-type product of Nippon Synthetic Chemical Industry Co., Ltd., comprising tolylene diisocyanate as the base), 25 parts of a plasticizer B and 0.05 part of hydroquinone under stirring at 165° C. 1.5 parts of dimethyl benzil ketal, and 1.5 parts of dibenzylidenesorbitol and 1.5 parts of N-lauroyl-L-glutamic acid α,γ-di-n-butylamide both as the gelling agent component were dissolved in the solution. Then the same procedure as in Example 7 was repeated to obtain a solid-state printing plate material.

This product was developable with a developer comprising a mixture of water and ethanol (weight ratio: 75/25) to yield a flexographic printing plate having a relief image having an excellent image reproducibility.

The plasticizer B was a compound obtained by an addition reaction of 136 parts (1 mol) of m-xylenediamine with 616 parts (2 mol) of ethylene oxide-modified phthaloyl acrylate and 392 parts (2 mol) of 2-ethylhexyl glycidyl ether.

Comparative Example 5:

A solid-state printing plate material was prepared in the same manner as in Example 9 except that no gelling agent component was used. Oozing of the components was recognized when the solid-state printing plate material was left to stand at room temperature supposedly because of a bleeding out of the urethane diacrylate used as the photoreactive oligomer.

Example 10:

10 parts of the same polyether esteramide as in Example 9 was added to a mixture of 45 parts of ethylene oxide-modified phthaloyl acrylate, 20 parts of maleic anhydride-modified liquid polybutadiene (M2000-20; a product of Nippon Petrochemicals Co., Ltd.) and 0.05 part of hydroquinone. Then the temperature was elevated to 110° C. and 25 parts of the same plasticizer B as in Example 9 was added under stirring and heating at 165° C. to obtain a homogeneous solution. 1.5 parts of benzil dimethyl ketal, and 1.5 parts of 12-hydroxystearic acid and 1.5 parts of dibenzylidenesorbitol both as the gelling agent component were added to the solution to obtain a homogeneous solution.

A flexographic printing plate was prepared from the solution in the same manner as in Example 9. In the practical flexographic printing tests with a water ink, alcohol ink or oil ink, excellent prints were obtained.

Examples 11, 12, 13, 14 and 15:

Flexographic printing plates having excellent flexographic printability could be obtained in the same manner as in Example 10 except that the maleic anhydride-modified liquid polybutadiene was replaced with:

(A) 15 parts of a liquid polybutadiene having a number-average molecular weight of about 1,000 (B 1000; a product of Nippon Petrochemicals Co., Ltd.), (B) 15 parts of a liquid polybutadiene having a number-average molecular weight of about 1,000 (B 2000; a product of Nippon Petrochemicals Co., Ltd.), (C) 15 parts of a liquid polyisoprene having a number-average molecular weight of about 9,000 (Kuraprene LIR-30; a product of Kuraray Isoprene Chemical Co., Ltd.), (D) 15 parts of a terminal-acryloylated liquid polybutadiene (Poly bd ACR-LC; a product of Idemitsu Arco), or (E) 15 parts of terminal-epoxidized liquid polybutadiene (Poly bd R45EPT; a product of Idemitsu Arco).

We claim:

1. A photosensitive composition containing a photoreactive monomer or oligomer; and a photoreaction initiator; and containing at least one compound selected from the group consisting of N-acyl amino acid derivatives and condensates of an aliphatic or aromatic aldehyde with a polyhydric alcohol having 2 to 40 carbon atoms.

2. A photosensitive composition containing a polyolefin or polyene having a number-average molecular weight of 30,000 to 500,000; a photoreactive monomer or oligomer; and a photoreaction initiator; and containing at least one compound selected from the group consisting of N-acyl amino acid derivatives, condensates of an aliphatic or aromatic aldehyde with a polyhydric alcohol having 2 to 40 carbon atoms, 12-hydroxystearic acid and condensates of polysaccharides with a fatty acid having 8 to 20 carbon atoms.

3. A photosensitive composition according to claim 2, containing 40 to 90 wt. % of the photoreactive monomer or oligomer, based on the total amount of the photosensitive composition.

4. A solid flexographic printing plate material comprising a layer of a photosensitive composition according to claim 2, and a support.

5. A photosensitive composition containing an alcohol-soluble polyamide or polyesteramide; a photoreactive monomer or oligomer; and a photoreaction initiator; and containing at least one compound selected from the group consisting of N-acyl amino acid derivatives, condensates of an aliphatic or aromatic aldehyde with a polyhydric alcohol having 2 to 40 carbon atoms, 12-hydroxystearic acid and its derivatives, acylated polysaccharides and a metallic soap.

6. A photosensitive composition according to claim 5, which contains 0.1 to 20 wt. % based on the total amount of the photosensitive composition of at least one compound selected from the group consisting of N-acyl amino acid derivatives, condensates of an aliphatic or aromatic aldehyde with a polyhydric alcohol having 2 to 40 carbon atoms, 12-hydroxystearic acid and its derivatives, acylated polysaccharides and a metallic soap.

7. A photosensitive composition according to claim 5, which contains at least two compounds selected from the group consisting of N-acyl amino acid derivatives, condensates of an aliphatic or aromatic aldehyde with a polyhydric alcohol having 2 to 40 carbon atoms, 12-hydroxystearic acid and its derivatives, acylated polysaccharides and a metallic soap.

8. A photosensitive composition according to claim 5, which contains 3 to 40% % of the alcohol-soluble polyamide or polyesteramide, 40 to 90 wt. % of the photoreactive monomer or oligomer, and 0.1 to 10 wt. % of the photoreaction initiator, all weight percentages based on the total amount of the photosensitive composition.

9. A solid printing plate material comprising a layer of a photosensitive composition according to claim 5 and a support.

10. A solid printing plate material according to claim 8, which is a flexographic printing plate material developable with water or an alcohol.

11. A solid printing plate material according to claim 10, wherein said layer of photosensitive composition comprises a heat-reversible gel and is prepared by flow-casting a substantially solvent-free composition.

12. A photosensitive composition containing an alcohol-soluble polyamide or polyester amide; a photoreactive monomer or oligomer; and a photoreaction initiator; and containing at least one compound selected from the group consisting of N-acyl amino acid amide, condensates of a benzaldehyde with a D-sorbitol and 12-hydroxystearic acid.

13. A photosensitive composition containing an alcohol-soluble polyamide or polyesteramide; a photoreactive monomer or oligomer at least partly comprising a polyene having a number-average molecular weight of 500 to 20,000; and a photoreaction initiator; and containing at least one compound selected from the group consisting of N-acyl amino acid derivatives, condensates of an aliphatic or aromatic aldehyde with a polyhydric alcohol, hydroxycarboxylic acids having 8 to 20 carbon atoms and their derivatives, acylated polysaccharides and metallic soap.

14. A photosensitive composition according to claim 13, which contains 1 to 30 wt. % based on the total amount of photosensitive composition of the polyene having a number-average molecular weight of 500 to 20,000.

15. A solid printing plate material comprising a layer of a photosensitive composition according to claim 13 and a support.

* * * * *